(12) United States Patent
Okamoto

(10) Patent No.: US 9,373,555 B2
(45) Date of Patent: Jun. 21, 2016

(54) POWER SEMICONDUCTOR MODULE, METHOD FOR MANUFACTURING THE SAME, AND POWER CONVERTER

(71) Applicant: FUJI ELECTRIC CO., LTD., Kawasaki-shi, Kanagawa (JP)

(72) Inventor: Kenji Okamoto, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/875,139

(22) Filed: Oct. 5, 2015

(65) Prior Publication Data

US 2016/0027709 A1    Jan. 28, 2016

Related U.S. Application Data

(63) Continuation of application No. PCT/JP2014/060178, filed on Apr. 8, 2014.

(30) Foreign Application Priority Data

Apr. 24, 2013  (JP) ................................. 2013-090971

(51) Int. Cl.
*H01L 23/48* (2006.01)
*H01L 23/045* (2006.01)
(Continued)

(52) U.S. Cl.
CPC ............ *H01L 23/045* (2013.01); *H01L 21/486* (2013.01); *H01L 21/4878* (2013.01); *H01L 21/52* (2013.01); *H01L 23/08* (2013.01);
(Continued)

(58) Field of Classification Search
CPC ... H01L 23/492; H01L 23/3675; H01L 21/52; H01L 23/08
See application file for complete search history.

(56) References Cited

U.S. PATENT DOCUMENTS 5,536,972 A * 7/1996 Kato ................... H01L 23/3121
257/706
6,650,559 B1   11/2003 Okamoto et al.
(Continued)

FOREIGN PATENT DOCUMENTS

EP      2 500 936 A1   9/2012
JP    2000-091481 A    3/2000
(Continued)

OTHER PUBLICATIONS

PCT, "International Search Report for International Application No. PCT/JP2014/060178".

*Primary Examiner* — Jarrett Stark
(74) *Attorney, Agent, or Firm* — Manabu Kanesaka

(57) ABSTRACT

A power semiconductor module includes a metal plate having a through hole with an eaves; an insulated metal block including a metal block having an element mounting region on an upper surface, and an insulating layer on surfaces other than the upper surface and a portion of the upper surface other than the element mounting region; a circuit pattern disposed over the metal plate with the insulating material interposed therebetween; a power semiconductor element fixed to the element mounting region of the upper surface of the metal block; and a connection conductor connecting the power semiconductor element and the circuit pattern. The insulated metal block is fitted into the through hole in the metal plate so that the insulating layer on the upper surface of the insulated metal block contacts the eaves of the through hole to electrically insulate between the metal block and the metal plate.

13 Claims, 9 Drawing Sheets

(51) Int. Cl.

| | |
|---|---|
| *H01L 23/36* | (2006.01) |
| *H01L 25/07* | (2006.01) |
| *H01L 25/18* | (2006.01) |
| *H01L 23/367* | (2006.01) |
| *H01L 23/373* | (2006.01) |
| *H01L 23/538* | (2006.01) |
| *H01L 21/48* | (2006.01) |
| *H01L 21/52* | (2006.01) |
| *H01L 23/08* | (2006.01) |
| *H01L 23/492* | (2006.01) |
| *H01L 23/498* | (2006.01) |
| *H02M 7/00* | (2006.01) |

(52) U.S. Cl.
CPC ............ *H01L23/36* (2013.01); *H01L 23/3675* (2013.01); *H01L 23/3677* (2013.01); *H01L 23/3735* (2013.01); *H01L 23/492* (2013.01); *H01L 23/49811* (2013.01); *H01L 23/49838* (2013.01); *H01L 23/5385* (2013.01); *H01L 25/07* (2013.01); *H01L 25/18* (2013.01); *H01L 2224/48091* (2013.01); *H01L 2924/1305* (2013.01); *H01L 2924/13055* (2013.01); *H01L 2924/19107* (2013.01); *H02M 7/003* (2013.01)

(56) References Cited

U.S. PATENT DOCUMENTS

| | | | | |
|---|---|---|---|---|
| 2002/0113302 | A1* | 8/2002 | Shinohara | H01L 23/4334 257/678 |
| 2005/0051789 | A1* | 3/2005 | Negley | H01L 33/486 257/99 |
| 2006/0097385 | A1* | 5/2006 | Negley | H01L 33/486 257/722 |
| 2006/0124953 | A1* | 6/2006 | Negley | H01L 23/486 257/99 |
| 2009/0140414 | A1* | 6/2009 | Soyano | H01L 25/072 257/698 |
| 2010/0128441 | A1* | 5/2010 | Soda | H01L 25/115 361/709 |

FOREIGN PATENT DOCUMENTS

| | | |
|---|---|---|
| JP | 2000-228466 A | 8/2000 |
| JP | 2005-142323 A | 6/2005 |
| JP | 3791772 B2 | 6/2006 |
| JP | 2007-012928 A | 1/2007 |
| JP | 2009-081246 A | 4/2009 |
| JP | 2011-114010 A | 6/2011 |
| WO | 2011/058607 A1 | 5/2011 |

* cited by examiner

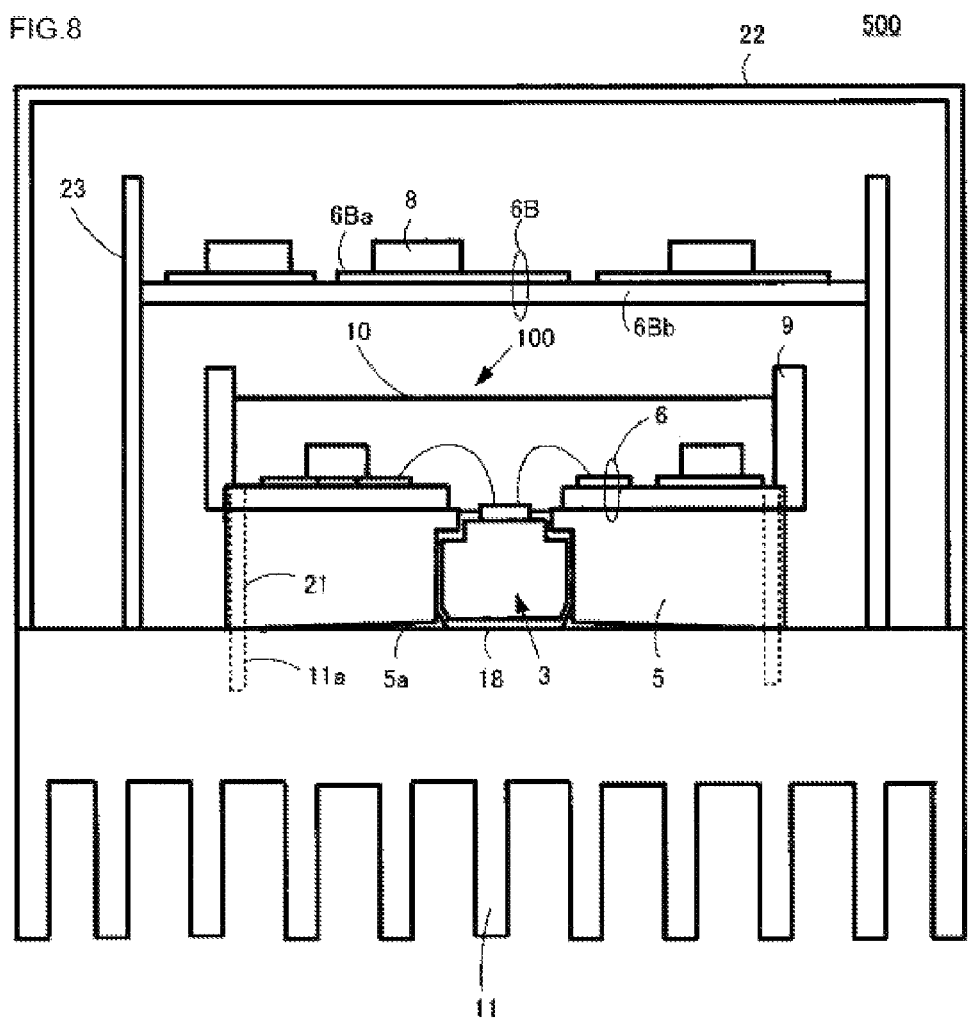

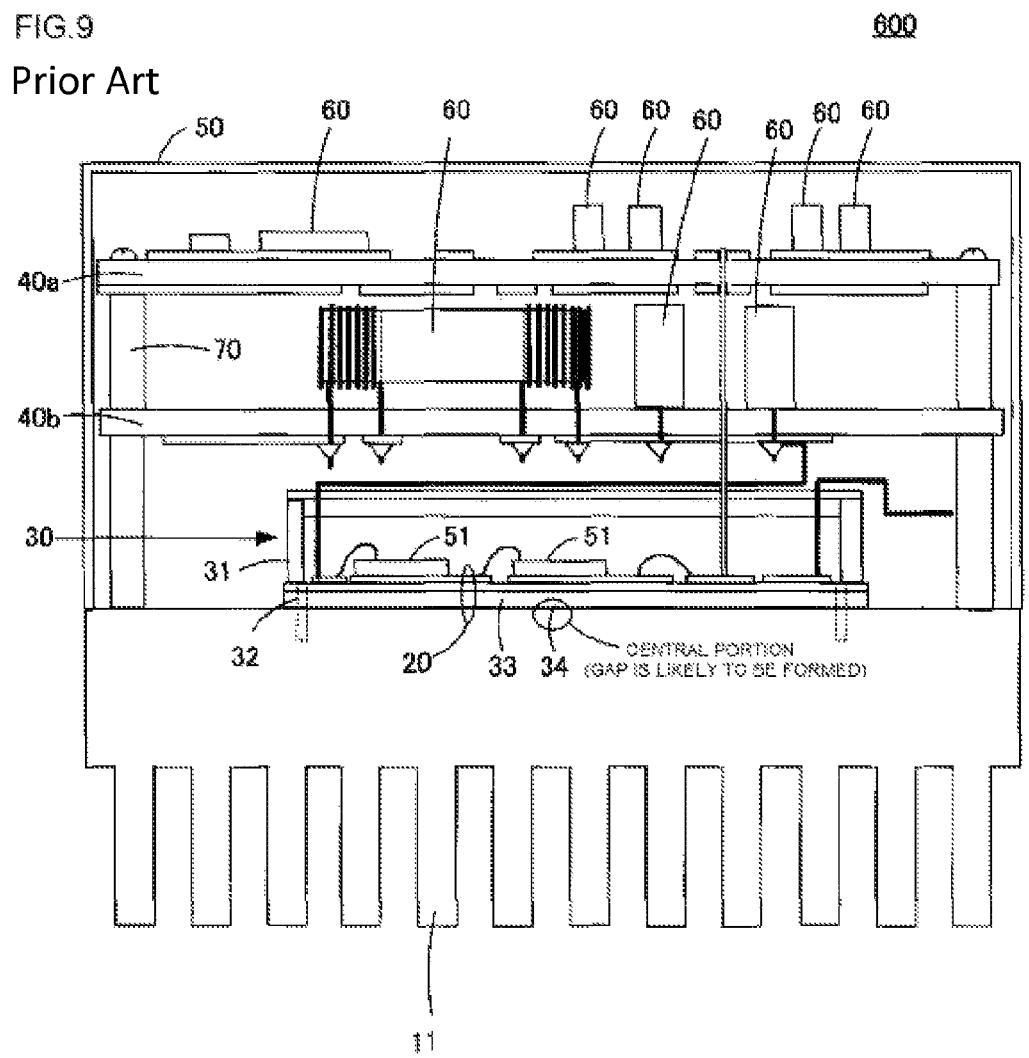

POWER SEMICONDUCTOR MODULE, METHOD FOR MANUFACTURING THE SAME, AND POWER CONVERTER

CROSS-REFERENCES TO RELATED APPLICATIONS

The present application is a Continuation Application of PCT International Application No. PCT/JP2014/060178 filed Apr. 8, 2014, claiming priority from Japanese Application No. 2013-090971 filed Apr. 24, 2013, the disclosure of which is incorporated herein.

TECHNICAL FIELD

The present invention relates to a power semiconductor module that is used in, for example, an inverter, a servo controller, and an uninterruptible power supply (UPS), a method for manufacturing the same, and a power converter.

BACKGROUND ART

The power semiconductor module is used in a wide power converter field from household electrical appliances, such as home air conditioners and refrigerators, to industrial electrical appliances, such as inverters and servo controllers.

The power semiconductor module is mounted on a direct copper bonding (DCB) substrate or a metal base printed wiring board with a high radiation performance in terms of power consumption. One or more circuit elements, such as power semiconductor elements, are mounted on the wiring board and a plastic case frame (resin case) is bonded to the wiring board. Then, the plastic case frame is sealed with a sealing material such as silicon gel or an epoxy resin. The metal base printed wiring board is one of the printed wiring boards including a copper film for a circuit pattern, a resin insulating layer, and a metal plate. A circuit pattern is formed on the upper surface of the metal base printed wiring board.

In addition, there is a full mold power semiconductor module using a transfer molding method in order to reduce manufacturing costs. In general, the power converter includes a main circuit using the above-mentioned power semiconductor module, a power circuit, and a control circuit. The power circuit or the control circuit includes various components, such as an integrated circuit (IC), a large scale integrated circuit (LSI), a resistor, a capacitor, and a reactor. In general, the power circuit or the control circuit is mounted on a printed circuit board.

Next, a power converter provided with a power semiconductor module 30 according to the related art disclosed in Patent Document 1 will be described.

FIG. 9 is a diagram illustrating the structure of a main portion of a power converter 600 including the power semiconductor module 30 according to the related art. In the power converter 600, the power semiconductor module 30 which includes a power semiconductor element 51 forming a main circuit is mounted on a heat sink 11 (hereinafter, also referred to as a "cooling fin"), with a thermal compound (thermal grease) (not illustrated) interposed therebetween, in order to increase the radiation performance. Printed circuit boards 40a and 40b on which electronic components 60 required for the power circuit or the control circuit other than the main circuit in the power converter 600 are mounted are provided above the power semiconductor module 30 with a gap therebetween and are fixed to the heat sink 11 by supports 70 (for example, pins). Then, all of the structures are covered with a case 50.

Patent Document 2 discloses a power converter having the following structure: a semiconductor device obtained by inserting a radiation plate (metal block) made of, for example, copper into a radiation plate insertion hole of a wiring board that has circuit wires formed on a resin substrate and fixing a semiconductor chip (power semiconductor element) to the upper surface of the radiation plate (metal block) using solder is mounted on a radiator (heat sink), with an insulating layer, which is formed on each of the rear surfaces of the resin substrate and the radiation plate (metal block), interposed therebetween.

CITATION LIST

Patent Document

Patent Document 1: Japanese Patent No. 3791772 (FIG. 10)

Patent Document 2: JP 2000-228466 A

DISCLOSURE OF THE INVENTION

Problem to be Solved by the Invention

In the power converter 600 illustrated in FIG. 9, the power semiconductor module 30 mounted on the heat sink 11 includes a metal base printed wiring board 20. The metal base printed wiring board 20 has a structure in which a metal base plate, an insulating film, and a circuit pattern are formed in this order from the heat sink 11 and the power semiconductor element 51 is fixed to the circuit pattern. Therefore, many materials (for example, the circuit pattern, the insulating film, and the metal base plate) are provided in a radiation path from the power semiconductor element 51 to the heat sink 11. As a result, thermal resistance increases, cooling characteristics are not sufficient, and it is difficult to sufficiently dissipate heat generated from the power semiconductor element 51 to the heat sink 11.

When the power semiconductor module 30 is attached to the heat sink 11, for example, screws are inserted into attachment holes 32 which are provided in an outer circumferential portion of the resin case 31 to fix the power semiconductor module 30 to the heat sink 11. In this case, a gap 34 is likely to be formed between the heat sink 11 and the vicinity of the center of a metal base plate 33 of the metal base printed wiring board 20. Therefore, a thermal compound (thermal grease) is applied onto a contact surface of the heat sink 11 and the power semiconductor module 30 is fixed to the heat sink 11. The gap 34 between the metal base plate 33 and the heat sink 11 is filled with the thermal compound to reduce contact thermal resistance.

However, when screwing is performed in the outer circumferential portion of the resin case 31, clamping pressure is not uniform in the entire contact surface between the power semiconductor module 30 and the heat sink 11, but is concentrated on the periphery of the contact surface. Therefore, for example, even when the thermal compound is applied onto the contact surface between the heat sink 11 and the metal base plate 33, the thermal resistance of the central portion of the power semiconductor module 30 is high. This phenomenon becomes remarkable as the contact area of the power semiconductor module 30 increases. A large heat sink 11 is required in order to improve the radiation performance, which results in an increase in costs.

Therefore, the problem to be solved is to bring the power semiconductor module 30 to contact the heat sink 11 at uniform pressure and to obtain a high radiation performance. The problem and the structure corresponding to the problem are also disclosed in Patent Document 2.

The invention has been made in order to solve the above-mentioned problem and an object of the invention is to provide a power semiconductor module that has a low cost and a high radiation performance, a method for manufacturing the same, and a power converter including the power semiconductor module.

Means for Solving Problem

In order to achieve the object, according to a first aspect of the invention, a power semiconductor module includes: a metal plate having a through hole with an eaves; and a metal block with the insulating layer in which an insulating layer made of a ceramic material is directly formed on surfaces other than an upper surface of a metal block and a portion other than an element mounting region in the upper surface. The metal block with the insulating layer is fitted to the through hole with the eaves in the metal plate such that an upper part thereof contacts with the eaves of the through hole with the eaves. A power semiconductor element is fixed to the element mounting region of the upper surface of the metal block. The power semiconductor element is connected to a circuit pattern, which is provided over the metal plate with the insulating material interposed therebetween, by a connection conductor.

According to the first aspect of the invention, in the power semiconductor module fixed to the heat sink for cooling, the lower surface of the metal block with a high heat capacity and a high radiation performance, which has the upper surface on which the power semiconductor element is fixed, can directly contact the heat sink through the insulating layer which is made of a ceramic material. According to this structure, it is possible to reduce the thermal resistance of the upper part of the power semiconductor element. Therefore, it is possible to improve the radiation performance of the power semiconductor module.

In addition, the metal block with the insulating layer in which the insulating layer made of the ceramic material is directly formed on the surfaces other than the upper surface of the metal block and the portion other than the element mounting region in the upper surface is fitted to the through hole with the eaves such that the upper part thereof contacts the eaves of the through hole with the eaves. Therefore, with the power semiconductor module fixed to the heat sink through the attachment holes which are formed in the circumferential portion of the metal plate by screwing, clamping pressure generated by the screwing is transmitted through the metal plate with high rigidity and is then transmitted from the eaves of the through hole with the eaves to the outer circumferential portion of the upper portion side of the metal block with the insulating layer. Therefore, uniform pressure is transmitted to the bottom surface of the metal block with the insulating layer. According to this structure, the bottom surface of the metal block with the insulating layer having the power semiconductor element fixed to the element mounting region of the upper surface comes into contact with the heat sink at uniform and sufficiently high pressure. Therefore, it is possible to obtain a high radiation performance.

As such, according to the first aspect of the invention, it is possible to effectively dissipate heat generated from the power semiconductor element. Therefore, it is possible to sufficiently reduce the temperature of the power semiconductor element during operation. As a result, the radiation surface area of the power semiconductor element is reduced and it is possible to use a power semiconductor element with a small size and a low cost.

Since the area of the power semiconductor element can be reduced, it is possible to further reduce the size of the metal block with the insulating layer on which the power semiconductor element is mounted and thus to further reduce the size of the metal plate having the through hole with the eaves to which the metal block with the insulating layer is fitted. Therefore, it is possible to reduce the size and costs of the power semiconductor module.

According to a second aspect of the invention, in the power semiconductor module according to the first aspect, the metal block with the insulating layer may be obtained by directly forming an insulating layer made of a ceramic material on surfaces other than an upper surface of a metal block, which has a convex step portion at the upper portion, and a portion other than an element mounting region in the upper surface. The metal block with the insulating layer may be fitted to the through hole with the eaves in the metal plate such that the insulating layer formed on a bottom surface of the step portion contacts the eaves of the through hole with the eaves.

According to the second aspect of the invention, the metal block in the metal block with the insulating layer is formed so as to have the convex step portion at the upper portion. When the convex step portion is not provided at the upper portion of the metal block, the upper surface of the power semiconductor element is lower than the upper surface of the circuit pattern by the sum of the thickness of the eaves of the through hole with the eaves in the metal plate and the thickness of the insulating material interposed between the metal plate and the circuit pattern. In this case, the difference in the thickness depends on the thicknesses of the power semiconductor element and the circuit pattern. In contrast, in the second aspect of the invention, the insulating layer which is formed on the bottom surface of the convex step portion provided at the upper portion of the metal block contacts the lower surface of the eaves of the through hole with the eaves and the power semiconductor element is fixed to the upper surface of the metal block which protrudes upward from the bottom surface of the step portion. According to this structure, the height of the upper surface of the power semiconductor element can be close to the height of the upper surface of the circuit pattern. Therefore, it is possible to facilitate the operation of connecting the power semiconductor element and the circuit pattern with a connection conductor such as an aluminum wire.

According to a third aspect of the invention, in the power semiconductor module according to the first or second aspect, a bottom surface of the metal block with the insulating layer may protrude from a rear surface of the metal plate.

According to the third aspect of the invention, the bottom surface of the metal block with the insulating layer protrudes from the rear surface of the metal plate. Therefore, when the area of the metal plate on which the circuit pattern is provided through the insulating material increases, it is possible to bring the bottom surface of the metal block with the insulating layer to contact the heat sink at uniform and sufficiently high pressure, with the semiconductor module fixed to the heat sink through the attachment holes which are provided in the circumferential portion of the metal plate by screwing. As a result, it is possible to reliably obtain a high radiation performance.

According to a fourth aspect of the invention, in the power semiconductor module according to any one of the first to third aspects, the thickness of the insulating layer may be equal to or greater than 50 μm and equal to or less than 2000 μm.

According to a fifth aspect of the invention, in the power semiconductor module according to any one of the first to fourth aspects, the insulating layer may be a ceramic layer that is made of at least one kind of material selected from a filler group including a silicon oxide, an aluminum oxide, a silicon nitride, an aluminum nitride, or a boron nitride.

According to a sixth aspect of the invention, in the power semiconductor module according to the fifth aspect, the insulating layer may be formed by depositing ceramic microparticles of the at least one kind of material selected from the filler group using a plasma spraying method.

According to a seventh aspect of the invention, in the power semiconductor module according to the fifth aspect, the insulating layer may be formed by depositing ceramic microparticles of the at least one kind of material selected from the filler group using an aerosol deposition method.

According to an eighth aspect of the invention, in the power semiconductor module according to any one of the first to seventh aspects, the circuit pattern may be a circuit pattern of a printed circuit board which is fixed to the metal plate and an electronic component may be fixed to the circuit pattern.

According to a ninth aspect of the invention, in the power semiconductor module according to the eighth aspect, another printed circuit board on which an electronic component is fixed may be provided above the printed circuit board.

According to the ninth aspect of the invention, some of the electronic components required for, for example, a power circuit or a control circuit other than the main circuit of the power converter are also mounted on another printed circuit board which is provided in the upper stage. Therefore, it is possible to reduce the area of the lower printed circuit board fixed to the metal plate and to reduce the area of the metal plate. As a result, it is possible to reduce the size of the power semiconductor module. In addition, since the area of the metal plate is reduced, it is possible to reduce the thickness of the metal plate which is required to prevent the warping of the metal plate screwed to the heat sink and thus to reduce the thickness of the metal block. Therefore, it is possible to reduce the weight of the power semiconductor module. Since the size and weight of the power semiconductor module can be reduced, it is possible to improve assemblability when the power semiconductor module is fixed to the heat sink to form the power converter and to reduce costs.

According to a tenth aspect of the invention, a power converter includes the power semiconductor module according to any one of the first to ninth aspects and a heat sink. The power semiconductor module is fixed to the heat sink such that a lower surface of the metal block contacts the heat sink, with the insulating layer interposed therebetween.

According to an eleventh aspect of the invention, a method for manufacturing a power semiconductor module includes: a step of forming a through hole with the eaves in a metal plate; a step of directly forming an insulating layer made of a ceramic material on surfaces other than an upper surface of a metal block and a portion other than an element mounting region in the upper surface to form a metal block with the insulating layer; a step of bonding a power semiconductor element to the element mounting region of the upper surface of the metal block; a step of fitting and fixing the metal block with the insulating layer to the through hole with the eaves in the metal plate such that an upper part thereof contacts the eaves of the through hole with the eaves; a step of forming a circuit pattern over the metal plate, with the insulating material interposed therebetween; and a step of connecting the power semiconductor element and the circuit pattern using a connection conductor.

According to a twelfth aspect of the invention, in the method for manufacturing a power semiconductor module according to the eleventh aspect, an insulating layer made of a ceramic material may be directly formed on surfaces other than an upper surface of a metal block, which has a convex step portion at an upper portion, and a portion other than an element mounting region in the upper surface to form the metal block with the insulating layer. The metal block with the insulating layer may be fitted and fixed to the through hole with the eaves in the metal plate such that the insulating layer formed on a bottom surface of the step portion contacts the eaves of the through hole with the eaves.

According to a thirteenth aspect of the invention, in the method for manufacturing a power semiconductor module according to the eleventh or twelfth aspect, the insulating layer may be formed by depositing ceramic microparticles of at least one kind of material selected from a filler group including a silicon oxide, an aluminum oxide, a silicon nitride, an aluminum nitride, or a boron nitride using any one of a plasma spraying method, an aerosol deposition method, or a sputtering method.

Effect of the Invention

According to the invention, it is possible to effectively dissipate heat generated from the power semiconductor element. Therefore, it is possible to use a power semiconductor element with a small area and a low cost and thus to manufacture a power semiconductor module with a high radiation performance at a low cost. In addition, when the power semiconductor module is mounted, it is possible to manufacture a small power converter at a low cost.

BRIEF DESCRIPTION OF DRAWINGS

FIGS. 1a-1d are diagrams illustrating the structure of a power semiconductor module 100 according to a first embodiment of the invention; wherein FIG. 1a is a plan view illustrating a main portion; FIG. 1b is a cross-sectional view illustrating the main portion taken along the line X-X of FIG. 1a; and FIGS. 1c and 1d are partial cross-sectional views illustrating different examples of the structure of the power semiconductor module;

FIG. 8 is a diagram illustrating the structure of a main portion of a power converter 500 according to a sixth embodiment of the invention; and FIG. 9 is a diagram illustrating the structure of a main portion of a power converter 600 including a power semiconductor module 30 according to the related art.

MODE(S) FOR CARRYING OUT THE INVENTION

Figure 1A:
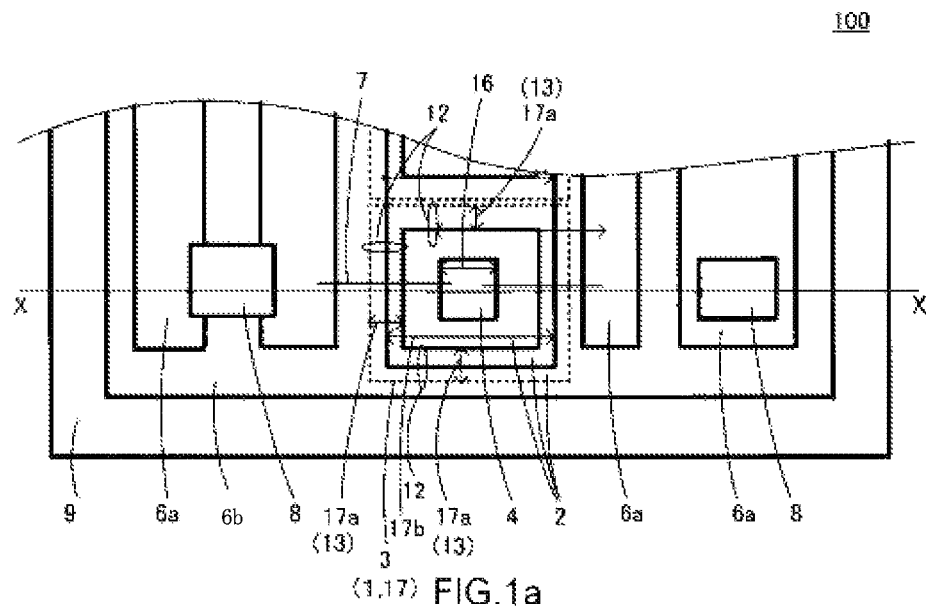

An embodiment of the invention will be described with reference to the following examples. The invention is not limited to the following embodiment and can be appropriately changed without departing from the scope and spirit of the invention. In addition, in the following description and the drawings, the same portions or components are denoted by the same reference numerals unless otherwise noted.

First Embodiment

Figure 1B:
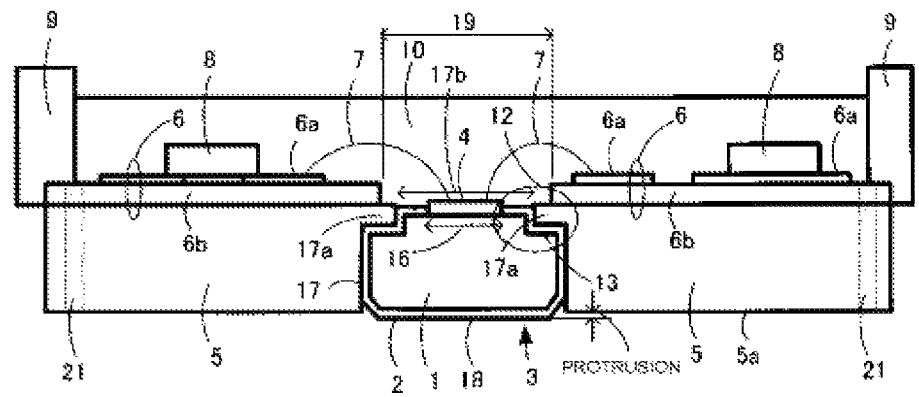
Figures 1C, 1D:
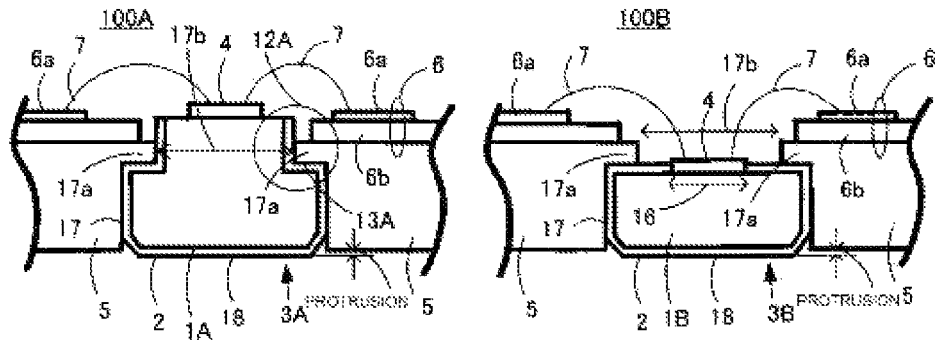

FIGS. 1a-1d are diagrams illustrating the structure of a power semiconductor module 100 according to a first embodiment of the invention. FIG. 1a is a plan view illustrating a main portion and FIG. 1b is a cross-sectional view illustrating the main portion taken along the line X-X of FIG. 1a. FIGS. 1c and 1d are partial cross-sectional views illustrating different examples of the structure of the power semiconductor module.

The power semiconductor module 100 includes a metal plate 5 in which a through hole 17 with an eaves 17a is provided, a metal block 3 with an insulating layer that has a convex step portion 12, which is fitted to the through hole 17 with the eaves, at the upper portion, and a power semiconductor element 4 (hereinafter, also referred to as a "semiconductor chip"), such as an insulated gate bipolar transistor (IGBT), which is directly fixed to an element mounting region, from which an upper surface of the metal block 1 is exposed, in an opening portion 16 of an insulating layer 2 of the metal block 3 with the insulating layer by, for example, solder.

The through hole 17 with the eaves in the metal plate 5 has a structure in which the eaves 17a that protrudes inward is provided at the upper end of an inner circumferential wall of an opening portion (through hole) that passes through the metal plate 5 in the thickness direction. In the power semiconductor module 100, as illustrated in FIG. 1b, the metal block 3 with the insulating layer is fitted and fixed to the through hole 17 with the eaves in the metal plate 5 such that a bottom surface 13 of a convex step portion 12 of the metal block 3 with the insulating layer, which is covered with the insulating layer 2, contacts the lower surface of the eaves 17a of the through hole 17 with the eaves in the metal plate 5.

Figure 6:
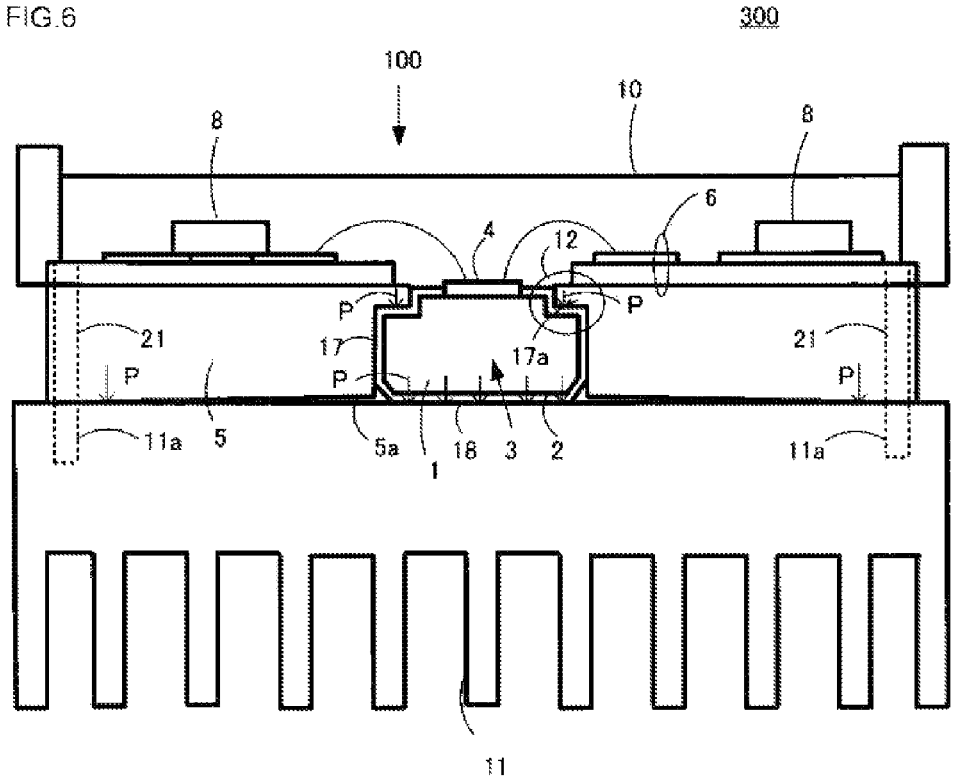
FIG. 6 is a diagram illustrating the structure of a main portion of a power converter 300 according to a fourth embodiment of the invention.

The metal block 3 with the insulating layer has a structure in which the insulating layer 2 made of a ceramic material is directly formed on surfaces other than the upper surface of the metal block 1 and a portion of the upper surface other than the element mounting region (opening portion 16). With the metal block 3 with the insulating layer fitted and fixed to the through hole 17 with the eaves in the metal plate 5, the electrical insulation between the metal block 1 and the metal plate 5 is ensured by the insulating layer 2. Therefore, as illustrated in FIG. 6 which will be described below, with the power semiconductor module 100 fixed to a heat sink 11 made of a metal material, the metal plate 5 directly contacts the heat sink 11 and has the same potential as the heat sink 11 and the metal block 1 is electrically insulated from the heat sink 11.

The metal block 1 is made of, for example, copper. However, the metal material forming the metal block 1 is not limited to copper. For example, the metal block 1 may be made of copper alloy, aluminum, or aluminum alloy.

In addition, the power semiconductor module 100 includes a printed circuit board 6 which is fixed onto the metal plate 5, an electronic component 8 which is fixed to a circuit pattern 6a of the printed circuit board 6, and an aluminum wire 7 which connects the power semiconductor element 4 and the circuit pattern 6a of the printed circuit board 6.

In the power semiconductor module 100, in addition to the power semiconductor element 4 forming the main circuit of a power converter, other electronic components forming a power circuit or a control circuit other than the main circuit of the power converter are needed. In addition, a circuit pattern for connecting the power semiconductor element 4 to the outside is needed. Therefore, as described above, the printed circuit board 6 having the circuit pattern 6a formed thereon is fixed onto the metal plate 5.

In a structure in which, for example, an IGBT is mounted as the power semiconductor element 4, a collector electrode formed on the rear surface of the IGBT is bonded to the element mounting region (the upper surface of the metal block 1) of the metal block 3 with the insulating layer and an emitter electrode and a gate electrode formed on the front surface of the IGBT are connected to the circuit pattern 6a of the printed circuit board 6 by the aluminum wires 7.

The printed circuit board 6 fixed onto the metal plate 5 includes an insulating substrate 6b which is made of, for example, glass epoxy (an epoxy resin reinforced by a glass fiber) and the circuit pattern 6a which is formed on the insulating substrate 6b. An opening portion 19 corresponding to an opening portion 17b formed by the eaves 17a of the through hole 17 with the eaves in the metal plate 5 is formed in a central portion of the printed circuit board 6. The material forming the insulating substrate 6b is not limited to the glass epoxy. The insulating substrate 6b may be made of an insulating material which can support the circuit pattern 6a while being electrically insulated from the metal plate 5.

The power semiconductor module 100 further includes a resin case 9 which is fixed to the outer circumference of the printed circuit board 6 and includes an external lead terminal (not illustrated) and a sealing material 10 such as silicon gel which is filled in the resin case 9.

The electronic components 8 illustrated in FIGS. 1a-1d are some of the components, such as inductors, resistors, and capacitors, which form the power circuit or the control circuit other than the main circuit in the power converter. In the drawings, reference numeral 17b indicates an opening portion formed by the eaves 17a and reference numeral 21 indicates an attachment hole which is provided in the outer circumferential portions of the metal plate 5 and the printed circuit board 6. For example, two attachment holes 21 are provided in the middle of each of two sides or four attachment holes 21 are provided at four corners, which is not illustrated in the plan view.

The insulating layer 2 is a ceramic layer which is formed using ceramic microparticles of at least one of a silicon oxide, an aluminum oxide, a silicon nitride, an aluminum nitride, or a boron nitride.

The metal block 3 with the insulating layer is fixed to the metal plate 5 such that the bottom surface (hereinafter, also referred to as a "lower surface") 18 of the metal block 3 with the insulating layer slightly protrudes from the rear surface (hereinafter, also referred to as "lower surface") 5a of the metal plate 5. The protruding height is about several tens of micrometers. When it is possible to make the rear surface 5a of the metal plate 5 flush with the bottom surface 18 of the metal block 3 with the insulating layer with high accuracy, the structure in which the bottom surface of the metal block 3 with the insulating layer protrudes from the rear surface 5a of the metal plate 5 is not required. In addition, when the area of the metal plate 5 is small, the bottom surface 18 of the metal block 3 with the insulating layer does not necessarily protrude from the rear surface 5a of the metal plate 5. However, at least a state in which the bottom surface 18 of the metal block 3 with the insulating layer is recessed from the rear surface 5a of the metal plate 5 should be avoided.

As described above, the metal block 3 with the insulating layer is fitted to the through hole 17 with the eaves formed in the metal plate 5 such that the bottom surface 18 thereof slightly protrudes from the rear surface 5a of the metal plate 5. The attachment holes 21 for screws are formed in the outer circumferential portions of the metal plate 5 and the printed circuit board 6 in order to fix the power semiconductor module 100 to a heat sink 11 for cooling (see FIG. 6).

The transmission of clamping pressure generated by screwing will be described with reference to FIG. 6. The outer circumferential portion of the metal plate 5 is closely attached and fixed to the upper surface of the heat sink 11 by screwing. Clamping pressure P generated by screwing is transmitted to the rigid metal plate 5 and is then transmitted from the eaves 17a of the through hole 17 with the eaves to the convex step portion 12 at the upper portion of the metal block 3 with the insulating layer. Since the step portion 12 is formed in the outer circumferential portion of the metal block 3 with the insulating layer, uniform pressure P is transmitted to the bottom surface 18 of the metal block 3 with the insulating layer. When the bottom surface 18 protrudes about several micrometers from the rear surface 5a of the metal plate 5, the contact pressure of the metal block 3 with the insulating layer with the heat sink is uniform and sufficiently high. As such, since the attachment pressure of the metal block 3 with the insulating layer to the heat sink 11 is uniform and sufficiently high, it is possible to obtain a high radiation performance. Of course, a thermal compound (thermal grease) can be applied onto the heat sink 11 to further improve the radiation performance.

The protrusion of the bottom surface 18 of the metal block 3 with the insulating layer makes it possible to bring the bottom surface 18 of the metal block 3 with the insulating layer to contact the heat sink 11 at uniform and sufficiently high pressure even when the number of electronic components 8 fixed to the printed circuit board 6 increases, the area of the printed circuit board 6 increases, and the size of the metal plate 5 to which the printed circuit board 6 is fixed increases.

In addition, since the power semiconductor element 4 is directly fixed to the metal block 1 which has a high heat capacity and a high radiation performance by, for example, solder, without passing through the insulating layer 2, it is possible to effectively dissipate heat generated from the power semiconductor element 4. Therefore, it is possible to sufficiently reduce the temperature of the power semiconductor element 4 during operation. As a result, the radiation surface area of the power semiconductor element (semiconductor chip) 4 is reduced, which makes it possible to use the power semiconductor element (semiconductor chip) 4 with a small size and area and to reduce costs.

As described above, since the contact between the metal block 3 with the insulating layer and the heat sink 11 is improved, the radiation surface area of the metal block 3 with the insulating layer is reduced. Therefore, it is possible to reduce the size of the metal block 3 with the insulating layer and thus to reduce costs.

Some of the electronic components 8 required for the power circuit or the control circuit other than the main circuit in the power converter are mounted on the printed circuit board 6 and are accommodated in the resin case 9. Therefore, it is possible to reduce the size of the power converter and to reduce costs.

As described above, since the insulating layer 2 in the bottom surface 18 of the metal block 3 with the insulating layer protrudes from the rear surface 5a of the metal plate 5, it is possible to reduce the contact thermal resistance between the power semiconductor module 100 and the heat sink 11. When the contact thermal resistance is reduced, it is possible to further reduce the temperature of the power semiconductor element 4 which increases during the operation of the power semiconductor module 100. Therefore, it is possible to further reduce the size of the power semiconductor element (semiconductor chip) 4 and thus to further reduce the size of the metal block 3 with the insulating layer. The reduction in the size makes it possible to reduce manufacturing costs.

Since the printed circuit board 6 is fixed to the metal plate 5, it is possible to effectively dissipate heat generated from the electronic component 8 to the metal plate 5. When there is a gap between the metal plate 5 and the heat sink 11, a thermal compound can be applied to improve the radiation performance. As a result, it is possible to densely arrange the electronic components 8 on the printed circuit board 6 and thus to reduce the size of the printed circuit board 6 and costs.

As such, the power semiconductor module 100 according to the invention has the structure in which the power semiconductor element 4 is directly fixed to the element mounting region, from which the upper surface of the metal block 1 is exposed, in the opening portion 16 of the insulating layer 2 of the metal block 3 with the insulating layer that has the convex step portion 12 at the upper portion by, for example, solder. Therefore, it is possible to obtain a high radiation performance and to reduce a module size and manufacturing costs, as compared to the power semiconductor module 30 of the power converter 600 according to the related art illustrated in FIG. 9 in which the power semiconductor element 51 is fixed to the circuit pattern of the metal base printed wiring board 20 to form the same circuit structure as described above.

The electronic component 60 required for the power circuit or the control circuit other than the main circuit in the power converter 600 is not mounted in the power semiconductor module 30 of the power converter 600 according to the related art illustrated in FIG. 9. Similarly to the related art, when the electronic component 8 required for the power circuit or the control circuit other than the main circuit is not mounted in the power semiconductor module 100 according to the invention, the power semiconductor module 100 has a higher radiation performance than the power semiconductor module 30 according to the related art and it is possible to reduce the size of the power semiconductor module 100. Therefore, it is possible to reduce manufacturing costs.

FIGS. 1c and 1d are partial cross-sectional views illustrating different examples of the structure of the power semiconductor module and illustrate the cross-sectional structure of a portion of the metal block with the insulating layer.

A power semiconductor module 100A illustrated in FIG. 1c differs from the power semiconductor module 100 illustrated in FIG. 1b in that a metal block 3A with the insulating layer includes a step portion 12A instead of the step portion 12 of the metal block 3 with the insulating layer. In the step portion 12A of the metal block 3A with the insulating, the height of a side surface is larger than that in the step portion 12 of the metal block 3 with the insulating layer. The upper surface of the metal block 3A with the insulating layer protrudes upward from the upper surface of the metal plate 5 in FIG. 1c. In the insulating layer 2 on the side surface of the step portion 12A, the height of a portion which protrudes from the upper surface of the metal plate 5 is effective as an insulation creepage distance between a metal block 1A and the metal plate 5. Therefore, when the protruding dimensions of the upper surface of the metal block 3A with the insulating layer from the upper surface of the metal plate 5 are set such that a sufficient insulation creepage distance can be ensured between the metal block 1A and the metal plate 5, the insulating layer 2 may not be formed on the entire upper surface of the metal block 1A forming the metal block 3A with the insulating layer, as illustrated in FIG. 1c. In the power semiconductor module 100A, a fitting structure between the metal block 3A with the insulating layer and a through hole 17 with the eaves in the metal plate 5 is the same as that in the power semiconductor module 100. The power semiconductor module 100A has the same structure as the power semiconductor module 100 except for the structure of the metal block with the insulating layer. In FIG. 1c, the overall structure of the power semiconductor module 100A is not illustrated.

A power semiconductor module 100B illustrated in FIG. 1d differs from the power semiconductor module 100 illustrated in FIG. 1b in that a metal block 3B with the insulating layer does not include the step portion 12 of the metal block 3 with the insulating layer. In the power semiconductor module 100B, as illustrated in FIG. 1d, the metal block 3B with the insulating layer is fitted and fixed to the through hole 17 with the eaves in the metal plate 5 such that a circumferential portion, which is covered with the insulating layer 2, in the upper surface of the metal block 3B with the insulating layer contacts the lower surface of the eaves 17a of the through hole 17 with the eaves in the metal plate 5. The power semiconductor module 100B has the same structure as the power semiconductor module 100 except for the structure of the metal block with the insulating layer. In FIG. 1d, the overall structure of the power semiconductor module 100B is not illustrated.

Second Embodiment

FIGS. 2a to 4c are cross-sectional views illustrating the order of the main manufacturing processes of a method for manufacturing the power semiconductor module 100 illustrated in FIGS. 1a-1b according to a second embodiment of the invention.

(1) First, a process of forming the metal block 3 with the insulating layer will be described.

Figure 2A:
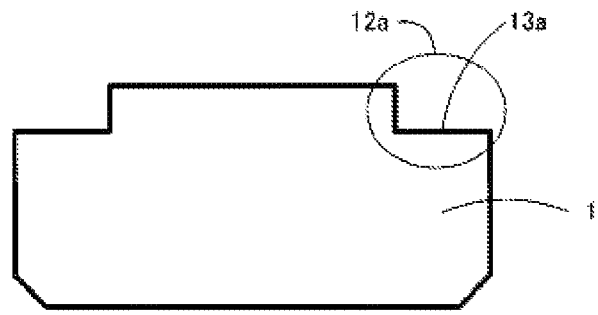
FIGS. 2a-2c are cross-sectional views illustrating a main manufacturing process of a method for manufacturing the power semiconductor module 100 illustrated in FIGS. 1a-1b according to a second embodiment of the invention.

In FIG. 2a, first, a copper plate with a thickness of about 1.0 mm to 5.0 mm is cut in a square shape or a rectangular shape by press working and the metal block 1 having the convex step portion 12a at the upper portion is formed. In FIG. 2a, reference numeral 13a indicates the bottom surface of the step portion 12a.

Figure 2B:
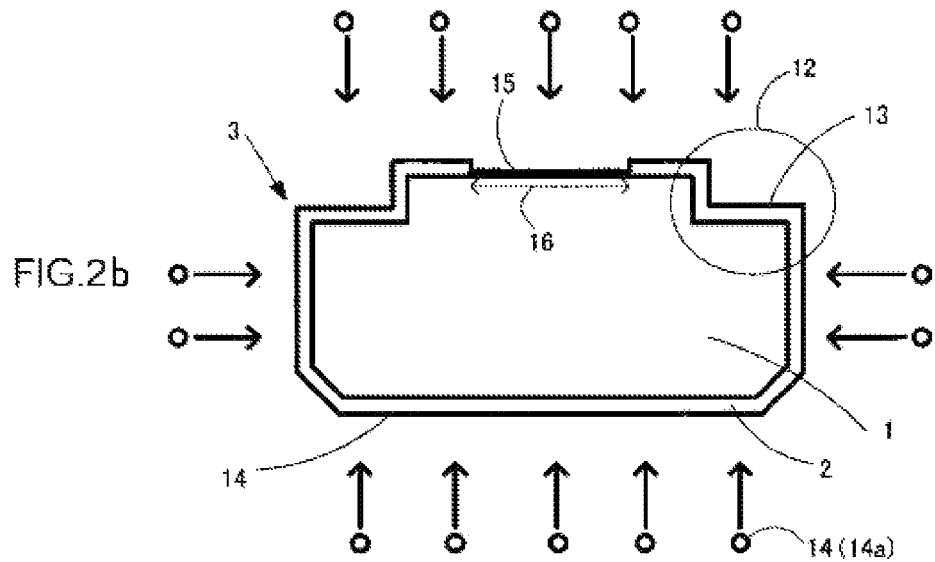

Then, in FIG. 2b, ceramic microparticles 14 (14a) are sprayed or deposited on the metal block 1 by a plasma spraying method or an aerosol deposition method to form the metal block 3 with the insulating layer which is covered with the insulating layer 2. In this case, a mask 15 is placed on a central portion of the upper surface of the metal block 3 with the insulating layer and the opening portion 16 (element mounting region) of the insulating layer 2 from which the upper surface of the metal block 1 is exposed is provided. The opening portion 16 is provided in order to directly fix the power semiconductor element (semiconductor chip) 4 to the exposed surface of the metal block 1 with, for example, solder and to electrically and mechanically bond the power semiconductor element 4 and the metal block 1. The other portions of the metal block 1 are covered with the insulating layer 2. FIG. 2b illustrates a case in which the metal block 1 is fixed and the ceramic microparticles 14 (14a) are sprayed or deposited on the metal block 1 in all directions. A method which sprays or deposits the ceramic microparticles 14 (14a) in one direction while rotating the metal block 1 may be used. However, the step portion 12a and the bottom surface 13a of the metal block 1 illustrated in FIG. 2a are changed to the step portion 12 and the bottom surface 13 which are covered with the insulating layer 2 in the metal block 3 with the insulating layer illustrated in FIG. 2b.

A method for covering the metal block 1 with the insulating layer 2 will be described.

[A] When Plasma Spraying Method is Used

Ceramic microparticles of at least one of a silicon oxide, an aluminum oxide, a silicon nitride, an aluminum nitride, or a boron nitride may be used as the ceramic microparticles 14 required to form the insulating layer 2.

The insulating layer 2 is formed in the atmosphere or under reduced pressure and the insulating layer 2 is deposited on the metal block 1 by a spraying method to form the metal block 3 with the insulating layer. The praying time (the order of seconds) can be controlled to adjust the thickness of the insulating layer 2. The thickness of the insulating layer 2 may be in the range of 50 μm to 2000 μm. The reason is that, when the thickness of the insulating layer 2 is less than 50 μm, dielectric breakdown strength is too low and it is difficult to apply the insulating layer 2 to a power semiconductor module with a rated voltage of 100 V or more. On the other hand, when the thickness of the insulating layer 2 is greater than 2000 μm, the insulating layer 2 is too thick and thermal resistance increases. Therefore, it is difficult to use this structure. Preferably, the thickness of the insulating layer 2 is equal to or greater than 50 μm and equal to or less than 500 μm. In addition, for example, when the thickness of the insulating layer 2 is about 200 μm, a dielectric breakdown strength of 5 kV or more is obtained at an AC breakdown voltage and this structure can be applied to a power semiconductor module with a rated breakdown voltage of 1200 V.

[B] When Aerosol Deposition Method is Used

The aerosol deposition method is a technique which mixes a microparticle or ultrafine particle raw material with gas to produce an aerosol and applies the aerosol onto a substrate (here, the metal block 1) through nozzles to form a film. Examples of the gas include helium and air. A film forming apparatus includes an aerosolization chamber and a deposition chamber. The deposition chamber is evacuated to about 50 kPa to 1 kPa by a vacuum pump.

The dried ceramic microparticle 14a or a dried ultrafine particle material, which is a raw material, is stirred and mixed with gas and is aerosolized in the aerosolization chamber. The microparticles (ultrafine particles) which have been aerosolized by the flow of gas generated by the pressure difference between the two chambers are transported to the deposition chamber, are accelerated through the nozzles on a slit, and are discharged to the metal block 1.

Crushed ceramics with a particle size of 0.1 μm to 2 μm are used as the ceramic microparticles 14a of the raw material. The ceramic microparticles 14a which have been transported by gas pass through the nozzles, which are very small openings, in the reduced-pressure chamber and are then accelerated to several hundreds of meters per second. A deposition speed or the density of a formed film depends on, for example, the particle size, agglomerated state, or dried state of the ceramic microparticles 14a used. Therefore, an agglomerated particle crusher or classifier is provided between the aerosolization chamber and the deposition chamber.

A mechanism for forming the insulating layer 2 on the metal block 1 in a film shape will be described.

When the ceramic microparticles 14a with a particle size of 0.1 µm to 2 µm are discharged onto the metal block 1 at a high speed, they are crushed into fine crystalline particles with a particle size of 10 nm to 30 nm by collision energy at that time and a new surface is formed. Then, the surface is activated and the particles are bonded to each other. Therefore, a ceramics film (insulating layer 2) with a dense nanocrystalline structure is formed. In addition, it is possible to form the ceramic film (insulating layer 2) at normal temperature, without particularly increasing the temperature.

It is preferable to use any one of an aluminum oxide, a silicon nitride, an aluminum nitride, or a boron nitride with a particle size of about 0.1 µm to 2 µm as the ceramic microparticles 14a which is deposited by the aerosol deposition method.

As the ceramic microparticle 14a, the following can be used: a microparticle obtained by forming an aluminum oxide film on a ceramic microparticle of any one of a silicon nitride, an aluminum nitride, or a boron nitride; or a microparticle obtained by forming a silicon oxide film on a ceramic microparticle of any one of a silicon nitride, an aluminum nitride, or a boron nitride. These ceramic microparticles 14a can be combined to form the composite insulating layer 2 including two or more kinds of ceramic microparticles.

The thickness of the insulating layer 2 may be in the range of 50 µm to 2000 µm as in the spraying method. Preferably, the thickness of the insulating layer 2 is equal to or greater than 50 µm and equal to or less than 500 µm. For example, when the thickness of the insulating layer 2 is about 200 µm, a dielectric breakdown strength of 5 kV or more is obtained at an AC breakdown voltage and this structure can be applied to a power semiconductor module with a rated breakdown voltage of 1200 V.

The insulating layer 2 may be formed by, for example, a sputtering method, in addition to the plasma spraying method and the aerosol deposition method.

(2) Next, a process of fixing the power semiconductor element (semiconductor chip) 4 to the metal block 3 with the insulating layer will be described.

Figure 2C:
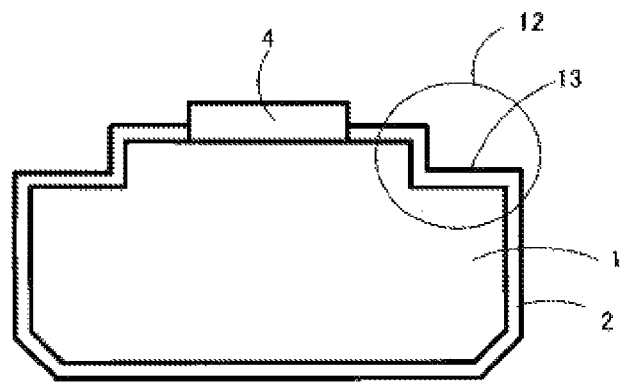

In FIG. 2c, the power semiconductor element (semiconductor chip) 4 is fixed to the opening portion 16 (element mounting region), from which the metal block 1 is exposed, in the upper surface of the metal block 3 with the insulating layer by, for example, solder and is electrically and mechanically bonded to the metal block 3 with the insulating layer.

The fixation with solder is generally performed with cream solder in a reflow furnace. Examples of the solder material include high-temperature solder made of SnPbAg and lead-free solder made of a SnAgCu-based material. The soldering temperature is set according to the melting point of solder.

When a void remains in the solder layer between the power semiconductor element (semiconductor chip) 4 and the metal block 3 with the insulating layer, thermal resistance increases and it is difficult to effectively dissipate heat generated from the power semiconductor element (semiconductor chip) 4. Therefore, the chamber is evacuated to a pressure of several torr (several hundreds of pascals) less than about 10 Torr ($10 \times 133$ Pa), with the solder being melted, such that no void is generated.

(3) Next, a process of forming the metal plate 5 will be described.

Figure 3A:
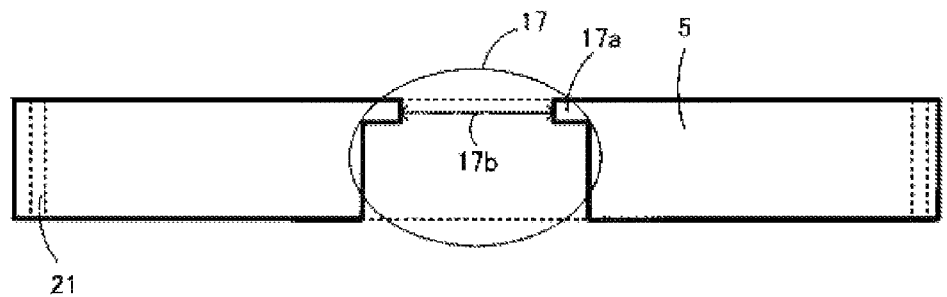
FIGS. 3a-3c are cross-sectional views that follow FIG. 2c and illustrate a main manufacturing process of the method for manufacturing the power semiconductor module 100 illustrated in FIGS. 1a-1b according to the second embodiment of the invention.

In FIG. 3a, the metal plate 5 to which the metal block 3 with the insulating layer is attached is prepared.

The through hole 17 with the eaves for fitting and fixing the metal block 3 with the insulating layer is formed in the vicinity of the center of the metal plate 5. The eaves 17a of the through hole 17 with the eaves contacts the bottom surface 13 of the convex step portion 12 of the metal block 3 with the insulating layer and transmits the pressure P which is transmitted downward from the metal plate 5 to the bottom surface 18 of the metal block 3 with the insulating layer. Therefore, the metal plate 5 requires high thermal conductivity and high rigidity. For example, an aluminum plate or a copper plate is used as the metal plate 5. The thickness t of the metal plate 5 varies depending on an area and may be set to about 1 mm to 5 mm such that the metal plate 5 does not warp. In FIG. 3a, reference numeral 17b indicates an opening portion formed by the eaves 17a.

(4) Next, a process of fitting and fixing the metal block 3 with the insulating layer to the through hole 17 with the eaves in the metal plate 5 will be described.

Figure 3B:
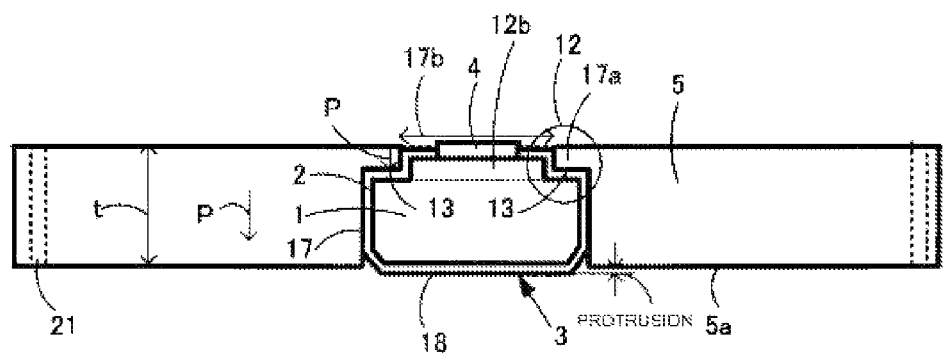

In FIG. 3b, the metal block 3 with the insulating layer is fitted and fixed to the through hole 17 with the eaves in the metal plate 5. In this case, the eaves 17a and the bottom surface 13 of the step portion 12 contacts each other such that the pressure P of the metal plate 5 is transmitted from the eaves 17a of the through hole 17 with the eaves to the bottom surface 13 of the convex step portion 12 of the metal block 3 with the insulating layer. Here, the design is made such that a protruding portion 12b of the convex step portion 12 is fitted to the opening portion 17b formed by the eaves 17a. In addition, the metal block 3 with the insulating layer may be fitted and fixed to the through hole 17 with the eaves by an adhesive so as not to be taken off the through hole 17 with the eaves.

The bottom surface 18 of the metal block 3 with the insulating layer, that is, the lower surface of the insulating layer 2 may protrude about several tens of micrometers from the rear surface 5a of the metal plate 5, in order to improve the contact between the heat sink 11 (see FIG. 6) and the metal block 3 with the insulating layer. However, in some cases, the rear surface 5a is flush with the bottom surface 18. In addition, in some cases, when the area of the metal plate 5 is small, the bottom surface 18 of the metal block 3 with the insulating layer does not protrude.

Next, a method for fitting and fixing the metal block 3 with the insulating layer to the metal plate 5 will be described.

The metal block 3 with the insulating layer is arranged, with a surface for mounting the power semiconductor element 4 facing upward. Then, the metal plate 5 is moved downward, with the through hole 17 with the eaves on an upper side, and the metal block 3 with the insulating layer is fitted and fixed to the through hole 17 with the eaves. Of course, contrary to the above-mentioned method, the metal plate 5 may be arranged, with the through hole 17 with the eaves on a lower side, the metal block 3 with the insulating layer may be moved downward, with the surface for mounting the power semiconductor element 4 facing downward, and then fitted and fixed to the through hole 17 with the eaves. During the fitting process, the bottom surface 13 of the convex step portion 12 which is provided at the upper portion of the metal block 3 with the insulating layer contacts the eaves 17a of the through hole 17 with the eaves. In this case, as described above, the thickness of the metal block 3 with the insulating layer is designed such that the bottom surface 18 of the metal block 3 with the insulating layer, that is, the lower surface of the insulating layer 2 protrudes about several tens of micrometers from the rear surface 5a of the metal plate 5.

As such, when the metal block 3 with the insulating layer is fitted and fixed to the through hole 17 with the eaves in the metal plate 5 and the metal plate 5 is screwed to the heat sink 11, the bottom surface 18 of the metal block 3 with the insulating layer contacts the heat sink 11 uniformly and with sufficiently high pressure.

This process will be described with reference to FIG. 6. When the downward pressure P is applied to the metal plate 5 by screwing, the pressure P is applied from the eaves 17*a* of the through hole 17 with the eaves which is formed in the metal plate 5 to the bottom surface 13 of the convex step portion 12 of the metal block 3 with the insulating layer. Since the convex step portion 12 is formed in the entire circumference of the upper part of the metal block 3 with the insulating layer, the pressure P is uniformly applied to the entire bottom surface 18 of the metal block 3 with the insulating layer and the bottom surface 18 of the metal block 3 with the insulating layer contacts the heat sink 11 with uniform pressure.

(5) A process up to the fixation of the electronic component 8 to the printed circuit board 6 will be described.

Figure 3C:
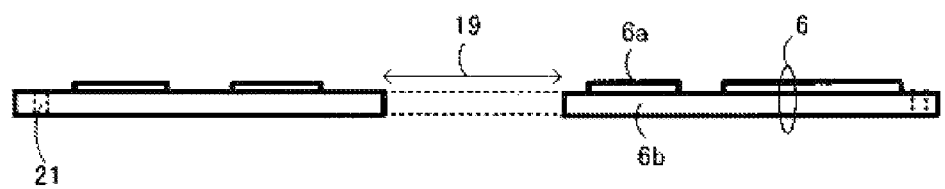

In FIG. 3*c*, the printed circuit board 6 to be attached to the metal plate 5 is prepared. The printed circuit board 6 includes the insulating substrate 6*b* which is made of, for example, glass epoxy (an epoxy resin reinforced by a glass fiber) and the circuit pattern 6*a* which is formed on the insulating substrate 6*b*. The opening portion 19 corresponding to the opening portion 17*b* formed by the eaves 17*a* of the through hole 17 with the eaves in the metal plate 5 is formed in the central portion of the printed circuit board 6. In addition, the attachment holes 21 are formed in the outer circumferential portion of the printed circuit board 6 in order to fix the power semiconductor module to the heat sink 11 with screws.

Figure 4A:
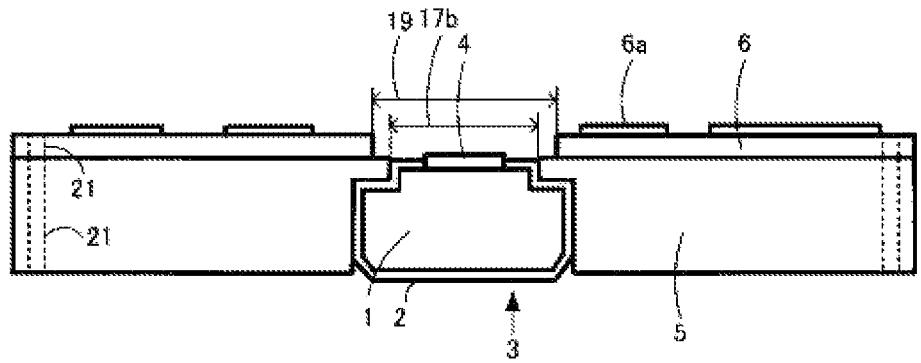
FIGS. 4a-4c are cross-sectional views that follow FIG. 3c and illustrates a main manufacturing process of the method for manufacturing the power semiconductor module 100 illustrated in FIGS. 1a-1b according to the second embodiment of the invention.

Then, in FIG. 4*a*, the opening portion 19 of the printed circuit board 6 is aligned with the opening portion 17*b* formed by the eaves 17*a* of the through hole 17 with the eaves in the metal plate 5 and the attachment holes 21 which are formed in the outer circumferential portions of the metal plate 5 and the printed circuit board 6 are aligned with each other. In this state, the printed circuit board 6 is attached to the metal plate 5 by an adhesive. In this cast, it is preferable that the adhesive have high thermal conductivity.

Figure 4B:
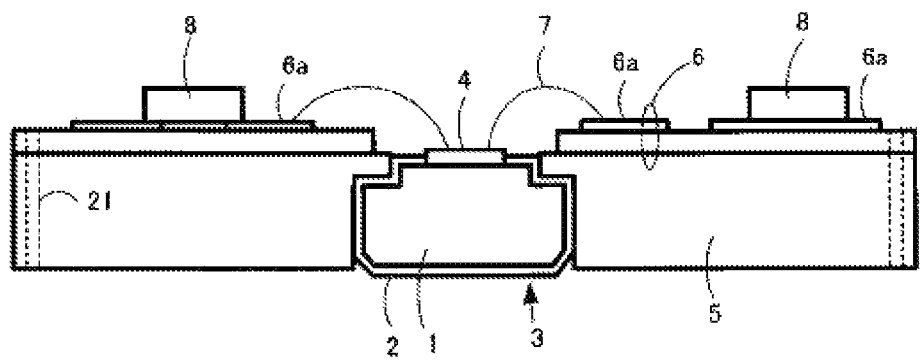

Then, in FIG. 4*b*, some of the electronic components 8 required for the power circuit or the control circuit other than the main circuit of the power converter are fixed to the printed circuit board 6. Then, the power semiconductor element 4 is connected to the circuit pattern 6*a* formed in the printed circuit board 6 by a connection conductor such as the aluminum wire 7. The aluminum wire 7 has a diameter of about 125 μm to 500 μm and is connected to each portion by ultrasonic bonding. In the connection process, a connection conductor, such as a lead frame or a ribbon-shaped aluminum wire, may be used instead of the aluminum wire 7. In addition, the electronic component 8 is fixed to the circuit pattern 6*a* of the printed circuit board 6 by, for example, solder.

(6) Next, processes from a process subsequent to the process (5) to the completion of the power semiconductor module 100 will be described.

Figure 4C:
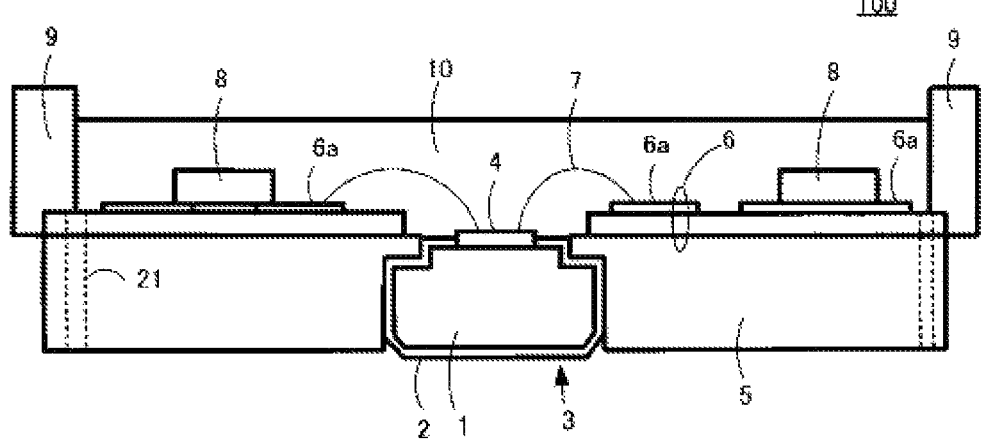

In FIG. 4*c*, the resin case 9 is fixed to the metal plate 5 (including the printed circuit board 6 in FIG. 4*c*) and the resin case 9 is filled with the sealing material 10, such as silicon gel, in order to electrically insulate the power semiconductor element 4 or the electronic component 8 fixed to the printed circuit board 6 and the circuit patterns 6*a* of the printed circuit board 6 or to protect the surfaces thereof. In addition, a filler, such as an epoxy resin or a urethane resin, may be used as the sealing material 10. The power semiconductor module 100 is completed by these processes.

Third Embodiment

Figure 5:
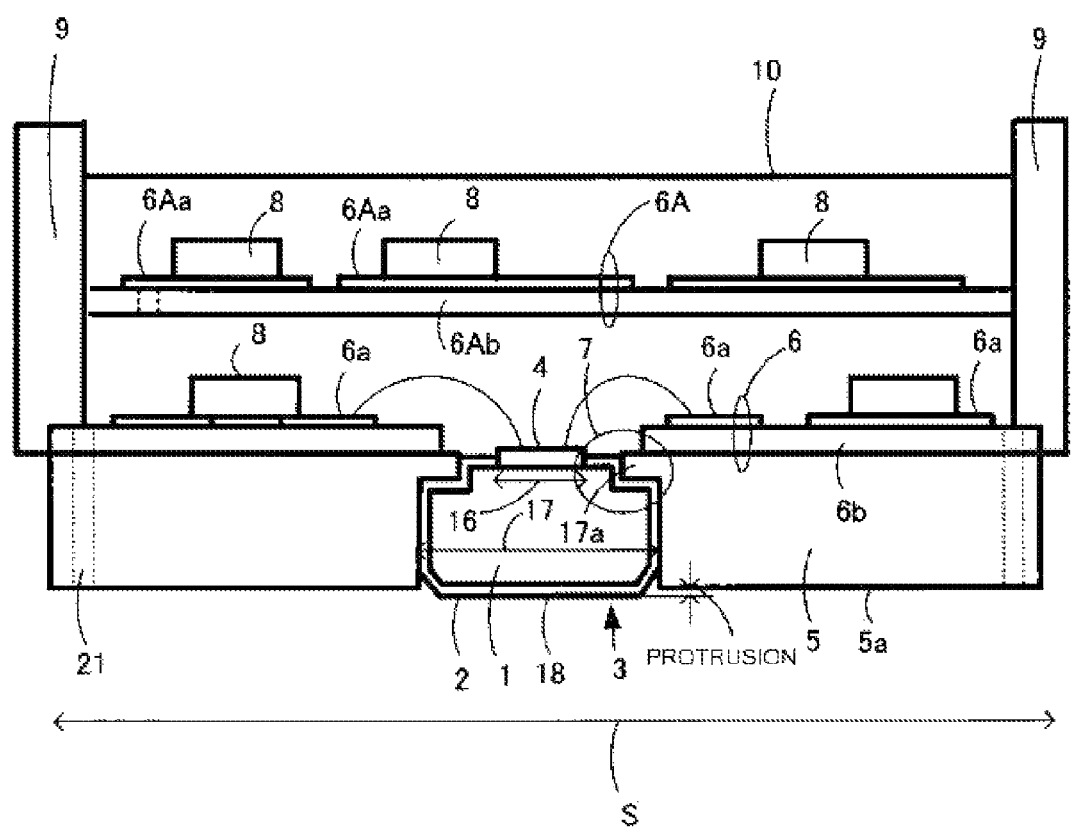
FIG. 5 is a diagram illustrating the structure of a main portion of a power semiconductor module 200 according to a third embodiment of the invention.

FIG. 5 is a diagram illustrating the structure of a main portion of a power semiconductor module 200 according to a third embodiment of the invention. The power semiconductor module 200 differs from the power semiconductor module 100 illustrated in FIGS. 1*a*-1*b* in that a printed circuit board for mounting electronic components required for a power circuit or a control circuit other than the main circuit of a power converter has a two-stage structure including a printed circuit board 6 that is attached to the upper surface of a metal plate 5 and a printed circuit board 6A that is provided above the printed circuit board 6 with a gap therebetween. Similarly to the above-mentioned printed circuit board 6, the printed circuit board 6A includes an insulating substrate 6Ab which is made of, for example, glass epoxy (an epoxy resin reinforced by a glass fiber) and a circuit pattern 6Aa which is formed on the insulating substrate 6Ab.

Similarly to the power semiconductor module 100 illustrated in FIGS. 1*a*-1*b*, the power semiconductor module 200 includes a resin case 9 which is fixed to the outer circumference of the printed circuit board 6 and includes an external lead terminal (not illustrated) and a sealing material 10 such as silicon gel which is filled in the resin case 9. The electronic components 8 illustrated in FIG. 5 are some of the components, such as inductors, resistors, and capacitors, which form the power circuit or the control circuit other than the main circuit in the power converter.

The printed circuit board 6A which is provided above the printed circuit board 6 with a gap therebetween is fixed to, for example, the inner circumferential surface of the resin case 9 and is supported by the resin case 9. Components including the printed circuit board 6A in the resin case 9 are sealed by the sealing material 10.

Some of the electronic components 8 required for the power circuit or the control circuit other than the main circuit in the power converter are also mounted on the upper printed circuit board 6A. Therefore, it is possible to reduce the area of the lower printed circuit board 6 and to reduce the area of the metal plate 5 to which the printed circuit board 6 is attached. As a result, it is possible to reduce the size of the power semiconductor module 200. In addition, since the area of the metal plate 5 is reduced, it is possible to reduce the thickness of the metal plate 5 which is required to prevent the warping of the metal plate 5 screwed to the heat sink 11 and thus to reduce the thickness of the metal block 1. Therefore, it is possible to reduce the weight of the power semiconductor module 200. Since the size and weight of the power semiconductor module 200 can be reduced, it is possible to improve assemblability when the power semiconductor module 200 is fixed to the heat sink 11 to form a power converter (a power converter 400 which will be described below) and to reduce costs. However, in FIG. 5, reference S indicates the floor area of the power semiconductor module 200. In this example, the printed circuit board with a two-stage structure has been described. However, a printed circuit board may be provided in three or more stages.

Fourth Embodiment

FIG. 6 is a diagram illustrating the structure of a main portion of a power converter 300 according to a fourth embodiment of the invention and illustrates an example of a power converter manufactured by fixing the power semiconductor module 100 illustrated in FIGS. 1*a*-1*b* to a heat sink (cooling fins) 11.

The power semiconductor module 100 illustrated in FIGS. 1a-1b is screwed to a heat sink (cooling fin) 11 for heat dissipation, with a thermal compound (thermal grease) interposed therebetween, to form a power converter 300. When the floor area of the power semiconductor module 100 is small, the thermal compound may not be used. For example, copper, copper alloy, aluminum, or aluminum alloy can be applied as a metal material forming the heat sink 11.

The power semiconductor module 100 is screwed to the heat sink 11 using the attachment holes 21 formed in an outer circumferential portion of the power semiconductor module 100 and screw holes 11a formed in the heat sink 11. For screwing in the outer circumferential portion, since the bottom surface 18 of the metal block 3 with the insulating layer protrudes from the rear surface 5a of the metal plate 5, the bottom surface 18 of the metal block 3 with the insulating layer contacts the heat sink 11 at uniform pressure. Therefore, a high radiation performance is obtained.

There are following advantages when a ceramic insulating layer which is formed by, particularly, the aerosol deposition method or the plasma spraying method described in the second embodiment is used as the insulating layer 2 forming the bottom surface 18 of the metal block 3 with the insulating layer, that is, the insulating layer 2 formed on the bottom (lower surface) of the metal block 1 in the power converter 300.

(1) Improvement of Dielectric Breakdown Voltage

In the aerosol deposition method, a film can be formed at room temperature (normal temperature) and ceramic microparticles with a particle size of submicrons collide with the substrate at a speed corresponding to a sound speed. Therefore, the ceramic microparticles whose active new surfaces are exposed are bonded to each other. This holds for the plasma spraying method. In each method, it is possible to form a ceramic microparticle layer which is a very dense electrical insulating film and no void is included in the film. Therefore, the breakdown voltage per unit length is about ten times higher than that in the ceramic plate which is formed by the sintering method according to the related art.

(2) Reduction in Thermal Resistance

Thermal conductivity is the same as that in a bulk. For example, a thermal conductivity of about 20 W/m·K can be ensured in an aluminum oxide ($Al_2O_3$), a thermal conductivity of about 20 160 W/m·K to 180 W/m·K can be ensured in an aluminum nitride (AlN), and a thermal conductivity of about 80 W/m·K can be ensured in a silicon nitride ($Si_3N_4$). In addition, since the breakdown voltage per unit length is improved, it is possible to reduce the thickness of the insulating layer 2. Therefore, the overall thermal resistance is reduced.

From these points, it is possible to ensure both the high insulating performance and the low thermal resistance of the insulating layer 2.

As such, the power converter 300 is formed such that the bottom surface (lower surface) of the metal block 1 having the power semiconductor element 4 mounted on the upper surface thereof contacts the heat sink 11 at uniform pressure, with the insulating layer 2, which is made of a ceramic material with high thermal conductivity, interposed therebetween. Therefore, it is possible to sufficiently reduce thermal resistance below the power semiconductor element 4 and to obtain a high radiation performance. As a result, it is possible to reduce the size and costs of the power converter, as compared to the structure according to the related art.

All of the electronic components 8 (for example, inductors, resistors, and capacitors) forming the power circuit or the control circuit other than the main circuit of the power converter 300 may be mounted on the printed circuit board 6. Alternatively, some of the electronic components may be mounted on the printed circuit board 6 and the other electronic component may be mounted on another printed circuit board (not illustrated) which is fixed to the heat sink 11.

Fifth Embodiment

Figure 7:
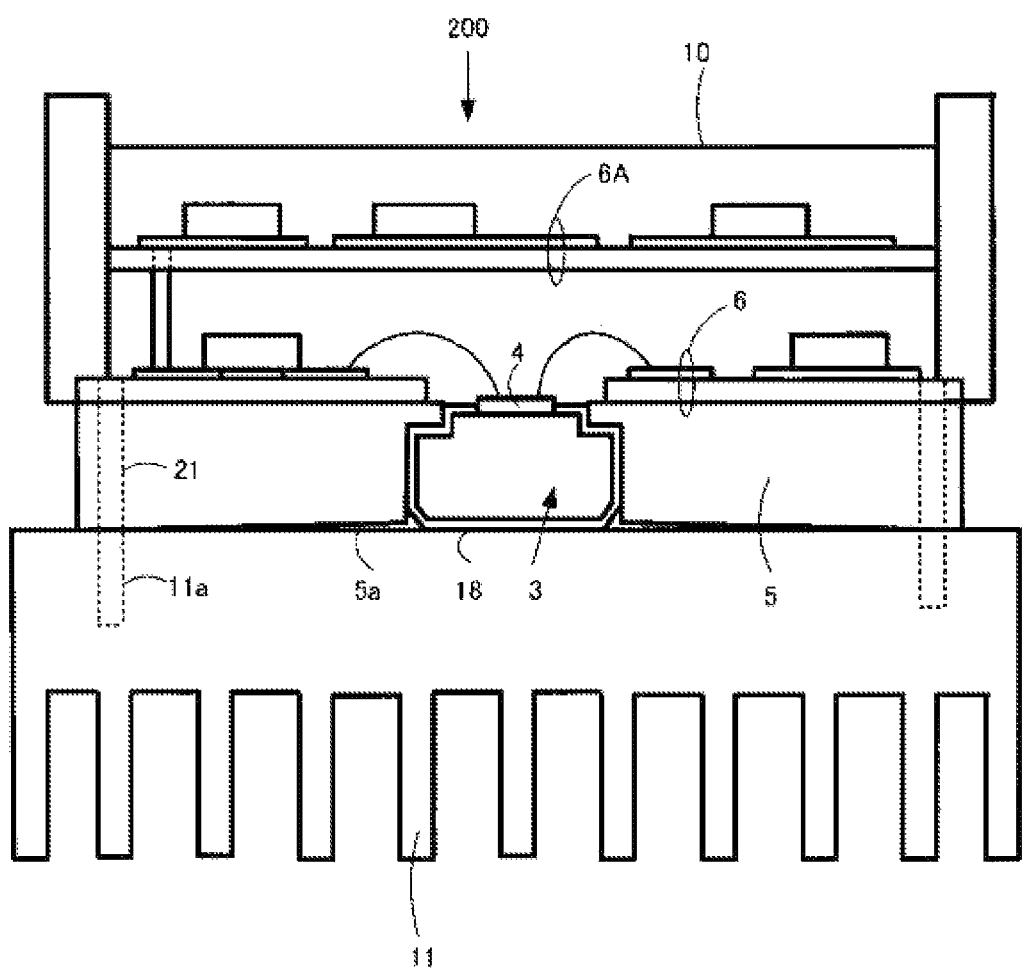
FIG. 7 is a diagram illustrating the structure of a main portion of a power converter 400 according to a fifth embodiment of the invention.

FIG. 7 is a cross-sectional view illustrating a main portion of a power converter 400 according to a fifth embodiment of the invention. The power converter 400 differs from the power converter 300 illustrated in FIG. 6 in that the power semiconductor module 200 provided with the two-stage printed circuit board is fixed to the heat sink (cooling fin) 11. In the power converter 400, since the floor area S of the power semiconductor module 200 is less than the floor area of the power semiconductor module 100 in the power converter 300, it is possible to further reduce the size of the heat sink 11. As a result, it is possible to further reduce the size and costs of the power converter 400, as compared to the power converter 300 illustrated in FIG. 6. In addition, when there are electronic components which are not capable of being mounted on the two printed circuit boards 6 and 6A among the electronic components forming the power circuit or the control circuit other than the main circuit of the power converter 400, the electronic components can be mounted on another printed circuit board (not illustrated) and the printed circuit board can be fixed to the heat sink 11 to form the power converter 400.

Sixth Embodiment

FIG. 8 is a cross-sectional view illustrating a main portion of a power converter 500 according to a sixth embodiment of the invention. The power converter 500 differs from the power converter 300 illustrated in FIG. 6 in that a printed circuit board 6B, on which some of electronic components 8 required for a power circuit or a control circuit other than a main circuit of the power converter 500 are mounted, is provided above the power semiconductor module 100, with a gap therebetween, and is covered with a case 22.

Similarly to the printed circuit boards 6 and 6A, the printed circuit board 6B includes an insulating substrate 6Bb which is made of, for example, glass epoxy (an epoxy resin reinforced by a glass fiber) and a circuit pattern 6Ba which is formed on the insulating substrate 6Bb. As illustrated in FIG. 8, a structure for supporting the printed circuit board 6B is formed by fixing the side end of the printed circuit board 6B to supports 23 provided on a heat sink 11. However, the invention is not limited to this structure. For example, the rear surface (lower surface) of the printed circuit board 6B may be fixed to the upper end of the resin case 9 in the power semiconductor module 100.

In the power converter 500, as described above, some of the electronic components 8 required for the power circuit or the control circuit other than the main circuit of the power converter 500 are mounted on the printed circuit board 6B which is provided outside the power semiconductor module 100. Therefore, it is possible to reduce the size of the printed circuit board 6 provided in the power semiconductor module 100 and to reduce the size of the metal plate 5 to which the printed circuit board 6 is attached. As a result, it is possible to reduce the size of the power semiconductor module 100.

Since the size of the printed circuit board 6 and the metal plate 5 forming the power semiconductor module 100 is reduced, the assemblability of the power semiconductor module 100 is improved and it is possible to reduce manufacturing costs.

The floor area of the power semiconductor module 100 in the power converter 500 is less than the floor area of the power semiconductor module 100 in the power converter 300. The size of the heat sink 11 depends on the structure for supporting the printed circuit board 6B. According to the above-mentioned structure, it is possible to reduce the size of the heat sink 11, with the reduction in the floor area of the power semiconductor module 100. Therefore, it is possible to reduce the size and costs of the power converter 500.

In FIG. 8, the power converter 500 has the structure in which one printed circuit board 6B having the electronic components 8 mounted thereon is provided above the power semiconductor module 100 with a gap therebetween. However, a plurality of printed circuit boards 6B may be provided.

What is claimed is:

1. A power semiconductor module comprising:
a metal plate having a through hole with an eaves;
an insulated metal block including a metal block having an element mounting region on an upper surface, and an insulating layer made of a ceramic material directly formed on surfaces other than the upper surface of the metal block and a portion other than the element mounting region on the upper surface, the insulated metal block being fitted into the through hole with the eaves in the metal plate so that an upper portion of the insulated metal block contacts the eaves of the through hole to electrically insulate between the metal block and the metal plate by the insulating layer;
a circuit pattern disposed over the metal plate with the insulating material interposed therebetween;
a power semiconductor element fixed to the element mounting region of the upper surface of the metal block; and
a connection conductor connecting the power semiconductor element and the circuit pattern.

2. The power semiconductor module according to claim 1, wherein the insulated metal block further comprises a convex step portion on an upper portion, and
the insulated metal block is fitted to the through hole with the eaves in the metal plate so that the insulating layer formed on a bottom surface of the step portion contacts the eaves of the through hole.

3. The power semiconductor module according to claim 1, wherein a bottom surface of the insulated metal block protrudes from a rear surface of the metal plate.

4. The power semiconductor module according to claim 1, wherein the insulating layer has a thickness equal to or greater than 50 μm and equal to or less than 2,000 μm.

5. The power semiconductor module according to claim 1, wherein the insulating layer is a ceramic layer made from at least one kind of material selected from a filler group consisting of a silicon oxide, an aluminum oxide, a silicon nitride, an aluminum nitride, or a boron nitride.

6. The power semiconductor module according to claim 5, wherein the insulating layer is formed of deposited ceramic microparticles of the at least one kind of material selected from the filler group, with plasma spraying.

7. The power semiconductor module according to claim 5, wherein the insulating layer is formed of deposited ceramic microparticles of the at least one kind of material selected from the filler group, with an aerosol deposition.

8. The power semiconductor module according to claim 1, wherein the circuit pattern is a circuit pattern of a printed circuit board fixed to the metal plate, and
an electronic component is fixed to the circuit pattern.

9. The power semiconductor module according to claim 8, further comprising another printed circuit board provided above the printed circuit board and fixed with the electronic component.

10. A power converter comprising:
the power semiconductor module according to claim 1; and
a heat sink,
wherein the power semiconductor module is fixed to the heat sink so that a bottom surface of the insulated metal block contacts the heat sink with the insulating layer interposed therebetween.

11. A method for manufacturing a power semiconductor module, comprising:
a step of forming a through hole with an eaves in a metal plate;
a step of directly forming an insulating layer made of a ceramic material on surfaces other than an upper surface of a metal block and a portion other than an element mounting region in the upper surface to form an insulated metal block;
a step of fixing a power semiconductor element to the element mounting region of the upper surface of the metal block;
a step of fitting and fixing the insulated metal block to the through hole with the eaves in the metal plate so that the insulating layer on the upper surface thereof contacts the eaves of the through hole to electrically insulate between the metal block and the metal plate;
a step of forming a circuit pattern over the metal plate, with the insulating material interposed therebetween; and
a step of connecting the power semiconductor element and the circuit pattern with a connection conductor.

12. The method for manufacturing a power semiconductor module according to claim 11, further comprising a step of forming a convex step portion on an upper portion of the insulated metal block,
wherein the insulated metal block is fitted and fixed to the through hole with the eaves in the metal plate so that the insulating layer formed on a bottom surface of the step portion contacts the eaves of the through hole.

13. The method for manufacturing a power semiconductor module according to claim 11, wherein the insulating layer is formed by depositing ceramic microparticles of at least one kind of material selected from a filler group consisting of a silicon oxide, an aluminum oxide, a silicon nitride, an aluminum nitride, or a boron nitride using any one of a plasma spraying method, an aerosol deposition method, or a sputtering method.

* * * * *